(12) United States Patent
Grundmann et al.

(10) Patent No.: US 9,812,609 B1
(45) Date of Patent: Nov. 7, 2017

(54) SEMICONDUCTOR DEVICE INCLUDING OXIDE CURRENT APERTURE

(71) Applicant: X Development LLC, Mountain View, CA (US)

(72) Inventors: Michael Grundmann, San Jose, CA (US); Martin F. Schubert, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 15/096,118

(22) Filed: Apr. 11, 2016

(51) Int. Cl.
*H01L 33/00* (2010.01)
*H01S 5/20* (2006.01)
*H01L 33/14* (2010.01)
*H01L 33/30* (2010.01)

(52) U.S. Cl.
CPC .......... *H01L 33/145* (2013.01); *H01L 33/30* (2013.01)

(58) Field of Classification Search
CPC ....... H01L 2924/12043; H01S 5/18311; H01S 5/18341; H01S 5/0425; H01S 5/02284; H01S 5/18308; H01S 5/18313; H01S 5/1833; H01S 5/3054
USPC ............ 372/96, 45.01, 46.01, 43.01, 46.013; 257/E33.069, 4
See application file for complete search history.

(56) References Cited

U.S. PATENT DOCUMENTS

| 5,882,948 | A | 3/1999 | Jewell | |
|---|---|---|---|---|
| 7,180,924 | B2 | 2/2007 | Kondo | |
| 7,504,322 | B2 | 3/2009 | Kauer | |
| 8,488,647 | B2* | 7/2013 | Arakida | H01S 5/0264 372/50.1 |
| 2001/0050934 | A1* | 12/2001 | Choquette | B82Y 20/00 372/50.11 |
| 2002/0150135 | A1* | 10/2002 | Naone | B82Y 20/00 372/45.011 |
| 2004/0016932 | A1* | 1/2004 | Kondo | H01L 24/82 257/80 |
| 2005/0117623 | A1* | 6/2005 | Shchukin | G02B 5/285 372/97 |
| 2013/0215922 | A1* | 8/2013 | Shimizu | H01S 5/18311 372/45.01 |

FOREIGN PATENT DOCUMENTS

| JP | 5019664 | 9/2012 |
|---|---|---|
| WO | WO 2015/121665 | 8/2015 |

* cited by examiner

*Primary Examiner* — Jonathan Han
(74) *Attorney, Agent, or Firm* — Christensen O'Connor Johnson Kindness PLLC

(57) ABSTRACT

Embodiments regard a semiconductor device including an oxide current aperture. An embodiment of a semiconductor device includes an N-type semiconductor layer; an active region on the N-type semiconductor layer, the N-type semiconductor layer located on a first side of the active layer; a P-type semiconductor layer located on a second, opposite side of the active layer; and one or more oxide current apertures including a first oxide current apertures in close proximity to the active region, wherein each oxide current aperture includes a non-oxidized region surrounded by an oxidized region.

17 Claims, 5 Drawing Sheets

SEMICONDUCTOR DEVICE INCLUDING OXIDE CURRENT APERTURE

TECHNICAL FIELD

This disclosure relates generally to electronic devices, and in particular but not exclusively, relates to a semiconductor device including an oxide current aperture.

BACKGROUND INFORMATION

In semiconductor devices, recombination is a process in which an electron and a hole annihilate each other. Recombination may be radiative, wherein the energy is converted to electromagnetic radiation, or non-radiative, where the energy is ultimately transferred to the semiconductor as heat.

Semiconductor bipolar devices can in particular suffer from non-radiative surface recombination at exposed surfaces, such as surfaces exposed during device fabrication through etch methods, and such non-radiative surface recombination can lead to poor performance, particularly in, for example, optoelectronic applications such as LED (light emitting diode) devices.

Small device geometries can further exacerbate this problem, as a higher volume fraction of the device's active region is close to the surface of the device, and thus increasing the probability of surface recombination.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Figure 1:
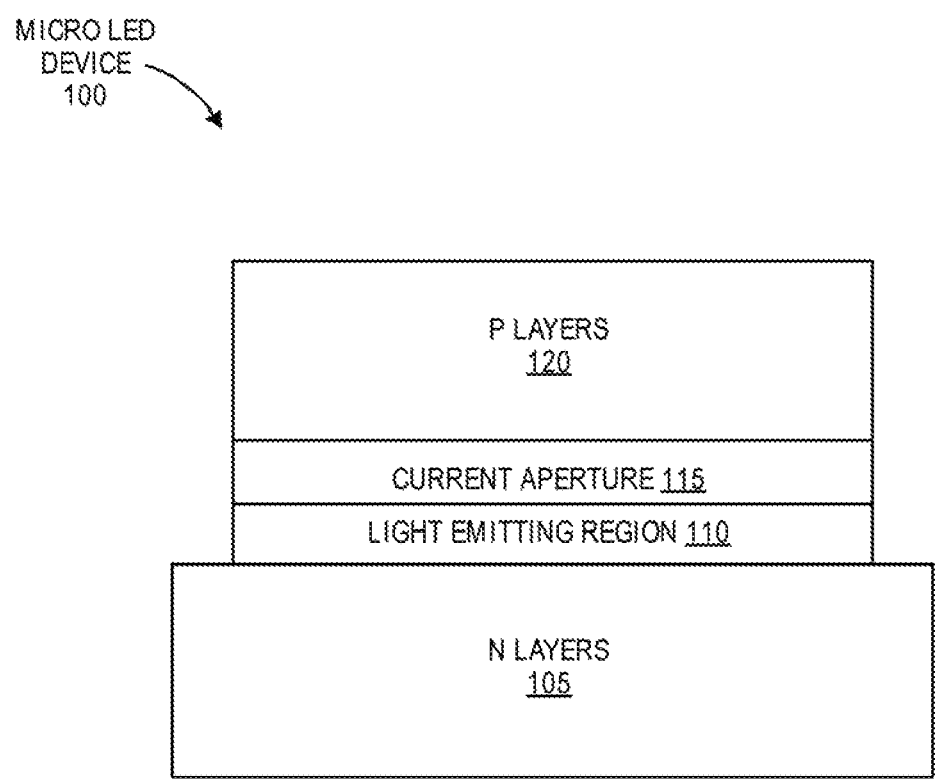
FIG. 1 is an illustration of a micro LED including one or more oxide current apertures according to an embodiment.

Embodiments of an apparatus, system, and process for a semiconductor device including an oxide current aperture.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In some embodiments, a semiconductor device includes one or more oxide current apertures to counter surface recombination, and thus to improve device performance.

Semiconductor devices may include light-emitting diodes (LEDs). An LED is a two-lead semiconductor light source device, which in general is a p-n junction diode that emits light when activated by a certain voltage. In operation, electrons recombine with holes within the device, releasing energy in the form of photons through the process of electroluminescence.

In a particular example, LED-based displays that use direct emissions from optoelectronic devices (rather than filtering the output of a light source) provide favorable performance for most display metrics. For this reason, therefore it is desirable to create LEDs with lateral dimensions of less than, for example, 20 microns to enable such direct emission displays.

However, non-radiative surface recombination can reduce performance of such devices. In particular, the current material system providing a best performance for red emitters (AlInGaP, aluminum gallium indium phosphide) will generally suffer from high non-radiative surface recombination rates. This decreases the system efficiency of any display made with such micro devices.

Surface recombination becomes increasingly important with micron sized emitters providing high performance operation. In particular, in small LEDs referred to herein as micro LEDs (in the range of 20 microns or less) there can be significant carrier recombination at the surface.

In such devices, if current flow is modified such that current density is high within the center of device, the surface recombination may be reduced. Due to low current density at the edges of the device, the number of carriers that directly undergo surface recombination is reduced. Further, due to high current density in the center of a device, the carrier lifetime is shortened, as compared to a device with uniform current density and a same total current, and the diffusion length of the carriers is also shortened, decreasing the probability that carriers recombine at the surface non-radiatively.

In the field of telecommunications, vertical cavity surface emitting lasers (VCSELs) for use at >800 nm (nanometers) in telecommunication applications use a particular oxide aperture to define a small active region to reduce the lasing threshold. These VCSELs are the wrong wavelength for a display, and are targeted for use as a laser so the viewing angle is not correct for a display. Devices with larger lateral dimensions do not generally suffer from this problem because most of the active volume is more than a diffusion length away from the surface of the device. Devices may further be passivated with dielectrics to reduce surface effects.

In some embodiments, an apparatus, system, or process include at least one oxidized semiconductor layer to construct an oxide current aperture in a LED chip, wherein the oxide current aperture is an aperture formed by oxide within the semiconductor to concentrate the current, yielding locally higher current density. In some embodiments, the oxide current aperture includes a non-oxidized region that is located at least in part in a center of the device, and thus may act to increase current density in a center of the device. In some embodiments, an oxidation process selectively converts a conducting semiconductor into an insulating layer, wherein the insulating layer forms the outer non-conducting region of the oxide current aperture. In some embodiments, a process includes deposit of certain oxidizing materials to allow oxidation and the formation of the oxide current aperture.

In an example, an oxide layer may form in certain materials containing aluminum under correct conditions. In some embodiments, a layer or multiple layers of AlAs (aluminum arsenide) or Al(Ga)As (aluminum gallium arsenide) may be deposited in close proximity to an active region. In some embodiments, the layer or layers are doped as a part of the formation of such layer or layers, wherein doping refers to introduction of impurities into intrinsic semiconductor to modulate electrical properties.

In some embodiments, for wafer processing, micron-sized mesas may formed using a wet or dry etch to expose the edges of layers to be oxidized. In some embodiments, an oxide current aperture is then formed beginning from the edge of the mesa progressing inwards in a wet or dry oxidizing environment (wherein the oxide producing region is formed during growth). In some embodiments, time and the chemical environment are utilized to control the desired oxidation rate and therefore the ultimate size of the non-oxidized region of the oxide current aperture. In some embodiments, the remainder of the device processing may proceed utilizing known device fabrication processes, which processes may include particular processes to form micron-sized devices.

In some embodiments, an oxide layer may be in a range of 1 nm as a minimum to 1 µm as a maximum in thickness, wherein a thickness and position may be optimized for highest efficiency within 2 µm of the active region.

In some embodiments, a semiconductor device includes an N-type semiconductor layer; an active region that is above the N-type semiconductor; a P-type semiconductor layer that is above the active region; and one or more oxide current apertures that are in close proximity to the active region, wherein each oxide current aperture includes a non-oxidized region surrounded by an oxidized region. Stated in another way, an oxide current aperture includes an inner layer portion that is non-oxidized and an outer layer portion that is oxidized, wherein the terms inner and outer refer to regions in the X- and Y-directions, with the Z-direction being perpendicular to the layers of the semiconductor device.

The dimensions and location of an oxide aperture may be expected to have certain operational effects, such as, for example, a location closer to the active region may cause deleterious effects on one type of efficiency while enhancing another. Such efficiency tradeoffs may affect design choices, and provide flexibility to tune a device to a particular current by, for example, tailoring the current density to reach maximum efficiency.

In some embodiments, an oxide aperture is located on the N-type side of the active region of the semiconductor device (i.e., is below the active region). In some embodiments, the thickness of the oxide aperture is less than 100 nm. In some embodiments, the thickness of the oxide aperture is less than 10 nm. In some embodiments, the thickness of the oxide aperture is less than 1 µm. In some embodiments, the oxide aperture is within 10 nm of the active region placement. In some embodiments, the oxide aperture is within 100 nm of the active region placement. In some embodiments, the oxide aperture is within 1 µm of the active region placement.

In some embodiments, an oxide aperture is located on the P-type side of the active region of the semiconductor device (i.e., is above the active region). In some embodiments, the thickness of the oxide aperture is less than 100 nm. In some embodiments, the thickness of the oxide aperture is less than 10 nm. In some embodiments, the thickness of the oxide aperture is less than 1 µm. In some embodiments, the oxide aperture is within 10 nm of the active region placement. In some embodiments, the oxide aperture is within 100 nm of the active region placement. In some embodiments, the oxide aperture is within 1 µm of the active region placement.

In some embodiments, an oxide aperture is embedded within the active region of the semiconductor device. In some embodiments, the oxide aperture is embedded by depositing large bandgap layers that may be oxidized interspersed with light emitting layers. In some embodiments, the oxide aperture has a thickness that is less than 10 nm. In some embodiments, the oxide aperture has a thickness that is less than 100 nm.

In some embodiments, a largest lateral dimension of an oxide aperture as measured from the oxide-semiconductor interface may also be specified, wherein the lateral dimension may similarly provide efficiency tradeoffs that may be utilized in tuning a device for a certain current. In some embodiments, the largest lateral dimension of the oxide aperture is 100 nm. In some embodiments, the largest lateral dimension of the oxide aperture is 10 µm. In some embodiments, the largest lateral dimension of the oxide aperture is 1 µm.

In some embodiments, a combination of the location and thickness of the oxide aperture is selected to optimize forward voltage, light output, light output pattern, current handling, reliability, or any combination thereof for a semiconductor device.

FIG. 1 is an illustration of a micro LED including one or more oxide current apertures according to an embodiment. As illustrated in FIG. 1, a micro LED device 100 includes (but is not limited to) N layers (N-type semiconductor material) 105; a light emitting region 110 (an active region to generate photons in an LED operation); one or more oxide current apertures including a first oxide current aperture 115; and P layers (P-type semiconductor material).

FIG. 1 illustrates an implementation in which the first oxide current aperture 115 is located on the P-type side of the light emitting region 110, but embodiments are not limited to this implementation, and further include embodiments in which the first oxide current aperture 115 is located on the N-type side of the light emitting region 110 or in which the first oxide current aperture 115 is contained within the light emitting region 110. Further, one or more additional oxide apertures may located on the P-type side of the light emitting region 110, on the N-type side of the light emitting region 110, or within the light emitting region 110. Similarly, for ease of explanation, FIG. 2A through FIG. 4 generally illustrate implementations in which an oxide current aperture is located on the P-type side of a light emitting region, but embodiments are not limited to these implementations.

In some embodiments, the first oxide current aperture 115 is generated by oxidation of an oxidizing material to address surface recombination issues in a device by restricting current flow, the current being directed through a non-oxidized region of the first oxide current aperture, thus increasing current density within the center of the device. In some embodiments, the non-oxidized region is located at least in part in center of the device.

Figure 2A:
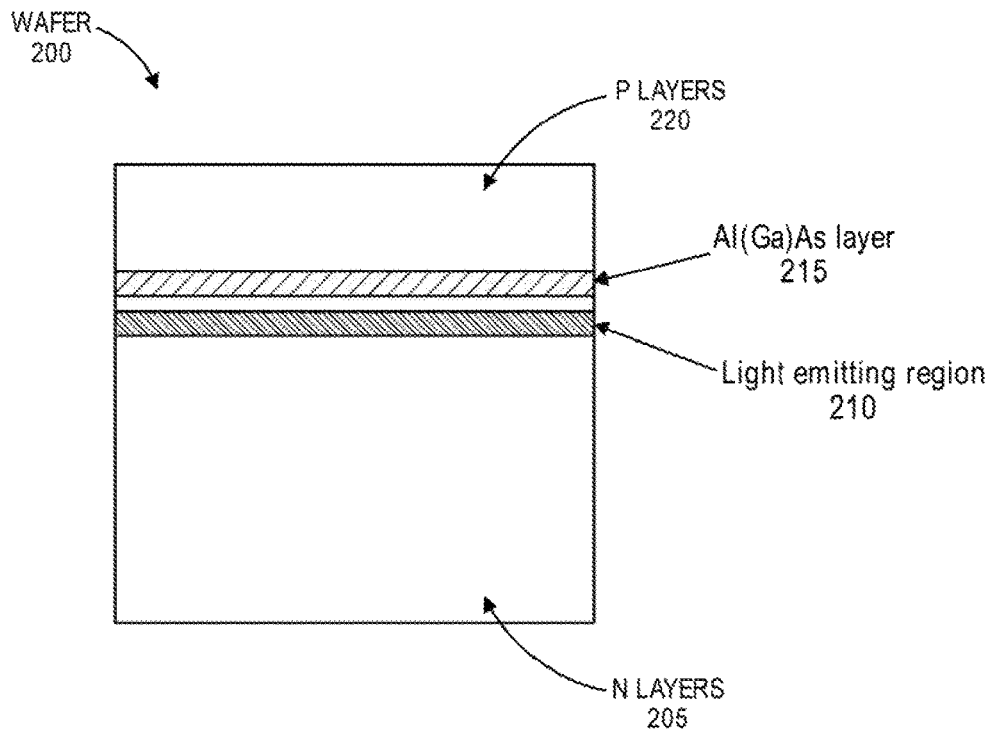
FIG. 2A is an illustration of epitaxial wafer grown for a device including an oxide current aperture according to an embodiment.
Figure 2B:
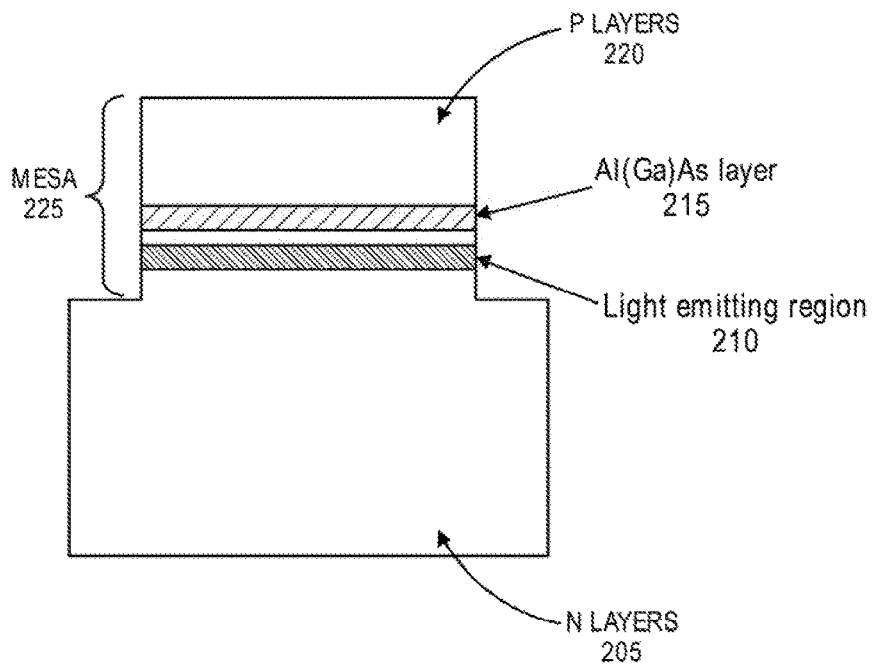
FIG. 2B is an illustration of mesa formation for a device including an oxide current aperture according to an embodiment.
Figure 2C:
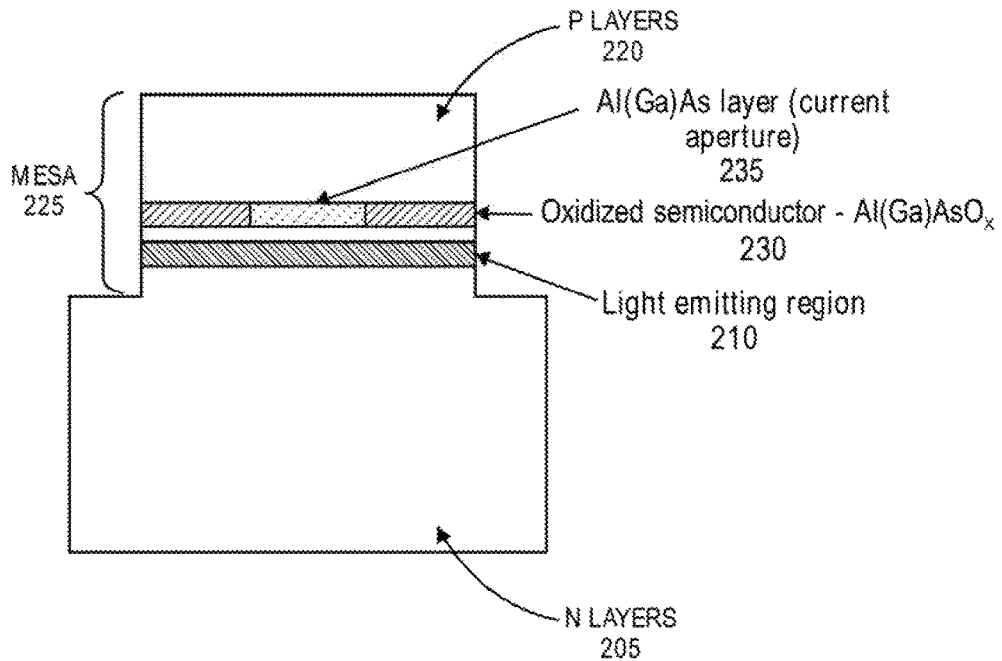
FIG. 2C is an illustration of semiconductor oxidization for a device including an oxide current aperture according to an embodiment.
Figure 2D:
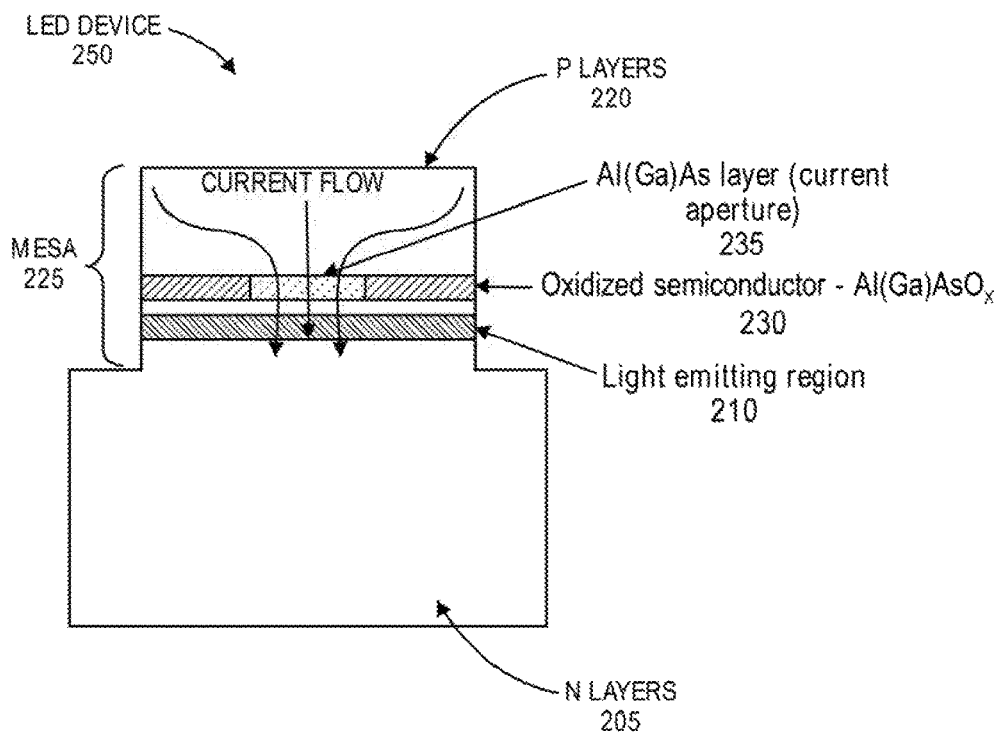
FIG. 2D is an illustration of device operation for a device including an oxide current aperture according to an embodiment.
Figure 3:
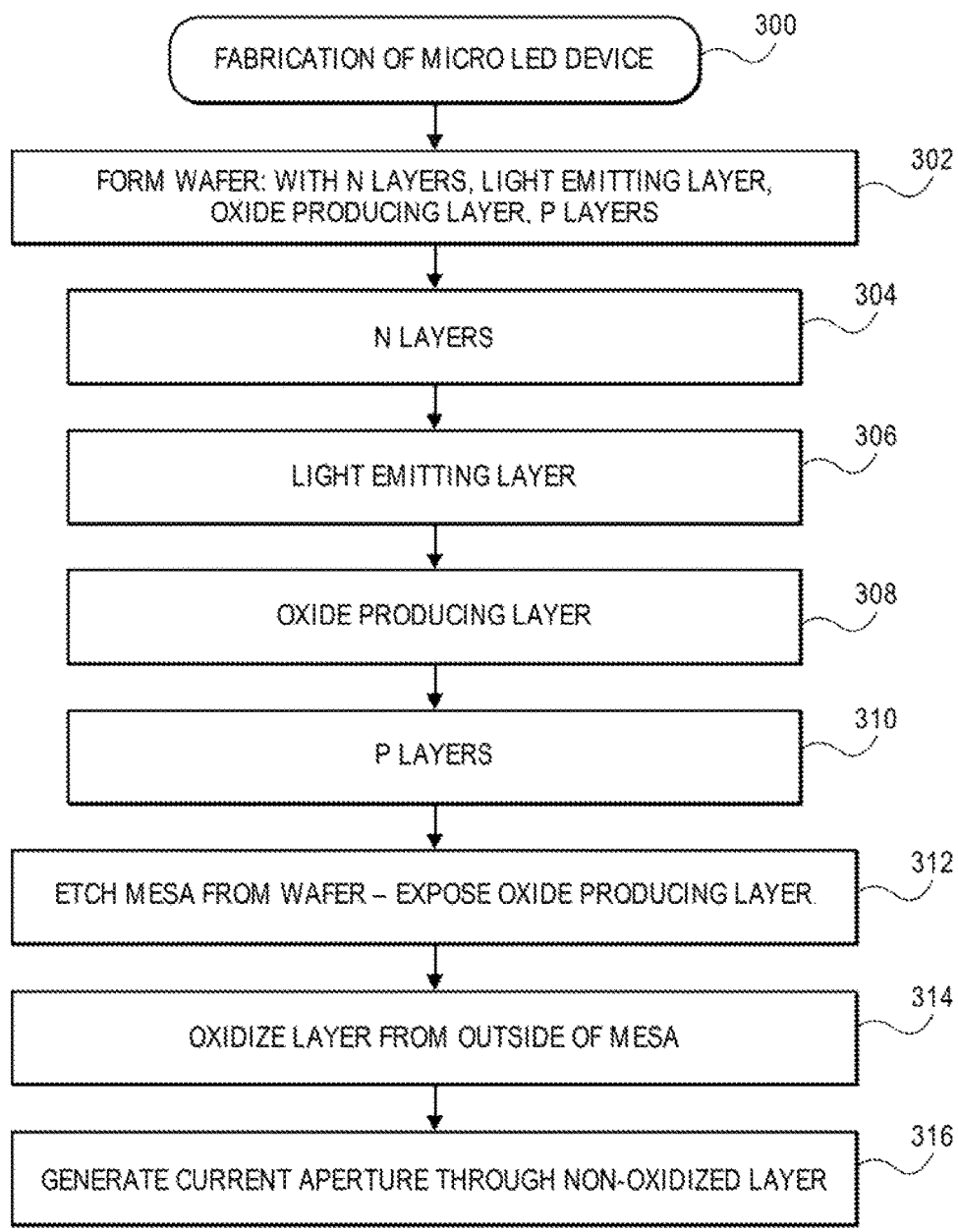
FIG. 3 is a flow chart to illustrate fabrication of a semiconductor device including an oxide current aperture according to an embodiment.

The fabrication of the micro LED device may include processes as illustrated in FIGS. 2A to 2D, and as illustrated in the flow chart provided in FIG. 3. While for ease of explanation FIGS. 2A to 2D illustrate the generation of a single oxide current aperture in a particular location on the P layer side of a light emitting region, embodiments are not limited to this particular location for an oxide current aperture, or to a single oxide current aperture.

FIG. 2A is an illustration of an epitaxial wafer grown for a device including an oxide current aperture according to an embodiment. In some embodiments, a wafer 200 is generated for a device utilizing an epitaxy process. Epitaxy refers to the deposition layer-by-layer of a crystalline overlayer on a crystalline substrate. The overlayer is called an epitaxial film or epitaxial layer. In some embodiments, an apparatus, system, or process provides for oxide formation in post-epi (after the epitaxy formation) processing.

As illustrated in FIG. 2A, the wafer 200 includes the N layers (N-type semiconductor material) 205, the light emitting region 210, an Al(Ga)As (aluminum gallium arsenide) layer 215 (or other layer to generate an oxide), and the P layers (P-type semiconductor material) 220. In some embodiments, an Al(Ga)As layer 215 is provided for purposes of generating an oxide current aperture to address surface recombination in a device. In an alternative embodiment, the aluminum or other oxidizing agent may be added at a later point in a process to generate the oxidation.

FIG. 2B is an illustration of mesa formation for a device including an oxide current aperture according to an embodiment. In some embodiments, as illustrated in FIG. 2B, the layers of the wafer 200 are etched to form a mesa 225, wherein the formation of the mesa 225 includes width reduction of at least the P layers 220, the Al(Ga)As layer 215, and the light emitting region 220. In some embodiments, for wafer processing, micron-sized mesas 225 may formed using a wet or dry etch to expose the edges of layers 215 to be oxidized.

In conventional processing, the generation of the mesa 225 may result in a device providing a large amount of non-radiative surface recombination because of factors including the small form factor, which results in a small distance to a device surface for any point within a device. In some embodiments, fabrication of the device includes generation of an oxide current aperture to counter such recombination effects in a small scale device.

FIG. 2C is an illustration of semiconductor oxidization for a device including an oxide current aperture according to an embodiment. In some embodiments, as illustrated in FIG. 2C, the mesa 225 includes the P layers 220, an Al(Ga)As layer current aperture, including a non-oxidized region 235 surrounded by an oxidized region 230, and the light emitting region 210, such layers being on the N layers 205.

In some embodiments, the outer portions of the Al(Ga)As layer 215 illustrated in FIG. 2C are oxidized to form aluminum gallium arsenide oxide, $Al(Ga)AsO_x$, shown as the region 230, wherein the remaining portion of the Al(Ga)As layer (element 215 in FIGS. 2A and 2B) forms a non-oxidized region 235 that is surrounded by the Al(Ga)$AsO_x$ oxide region 230. The non-oxidized current aperture region 235 and the surrounding $Al(Ga)AsO_x$ oxide region 230 are referred to herein as an oxide current aperture.

In some embodiments, the amount and the location of the oxidized portion 235 are controlled by the particular chemical environment, which act to encourage or discourage the formation of oxide, and the passage of time. In some embodiments, the oxidation process is designed to generate an oxide current aperture that provides an optimized performance for a semiconductor device (such as a micro LED device), where such the particular requirements for a semiconductor device may vary depending on implementation.

FIG. 2D is an illustration of device operation for a device including an oxide current aperture according to an embodiment. In some embodiments, as illustrated in FIG. 2D, a micro LED device 250 includes a mesa region 225 containing P layers 220, an Al(Ga)As layer current aperture 235 surrounded by an oxidized $Al(Ga)O_x$ region 230, and light emitting region 210, such layers being formed on the N layers 205.

In some embodiments, the current flow of the micro LED device is forced through the oxide current aperture 235 as it cannot pass through the oxidized region 230. In this manner the amount of current flowing near the surface of the device is reduced, which in turn reduces the level of surface recombination occurring in the device 250 and thus improves the operation of the device 250.

FIG. 3 is a flow chart to illustrate fabrication of a semiconductor device including an oxide current aperture according to an embodiment. FIG. 3 illustrates a particular implementation in which oxide producing layers are formed subsequent to formation of an active/light emitting layer, but embodiments are not limited to this implementation, and processes may be modified or implemented in a different order in other embodiments. Further, in some embodiments, fabrication of a semiconductor may include formation of multiple oxide current apertures.

In some embodiments, a process for fabrication of a device such as a micro LED device 300 includes:

302: Forming a wafer with an epitaxial process for the device, including, but not limited to, the following:

304: Formation of one or more N layers,

306: Formation of active/light emitting layer,

308: Formation of one or more oxide producing layers, including doping of the one or more layers, and 310: Formation of one or more P layers.

312: Etching mesa from layer and expose oxide producing layer.

314: Oxidizing the oxide producing layer to produce an oxide current aperture having a non-oxidized region surrounded by an oxidized region.

316: Generating the oxide current aperture through the non-oxidized region of the oxide producing layer.

Figure 4:
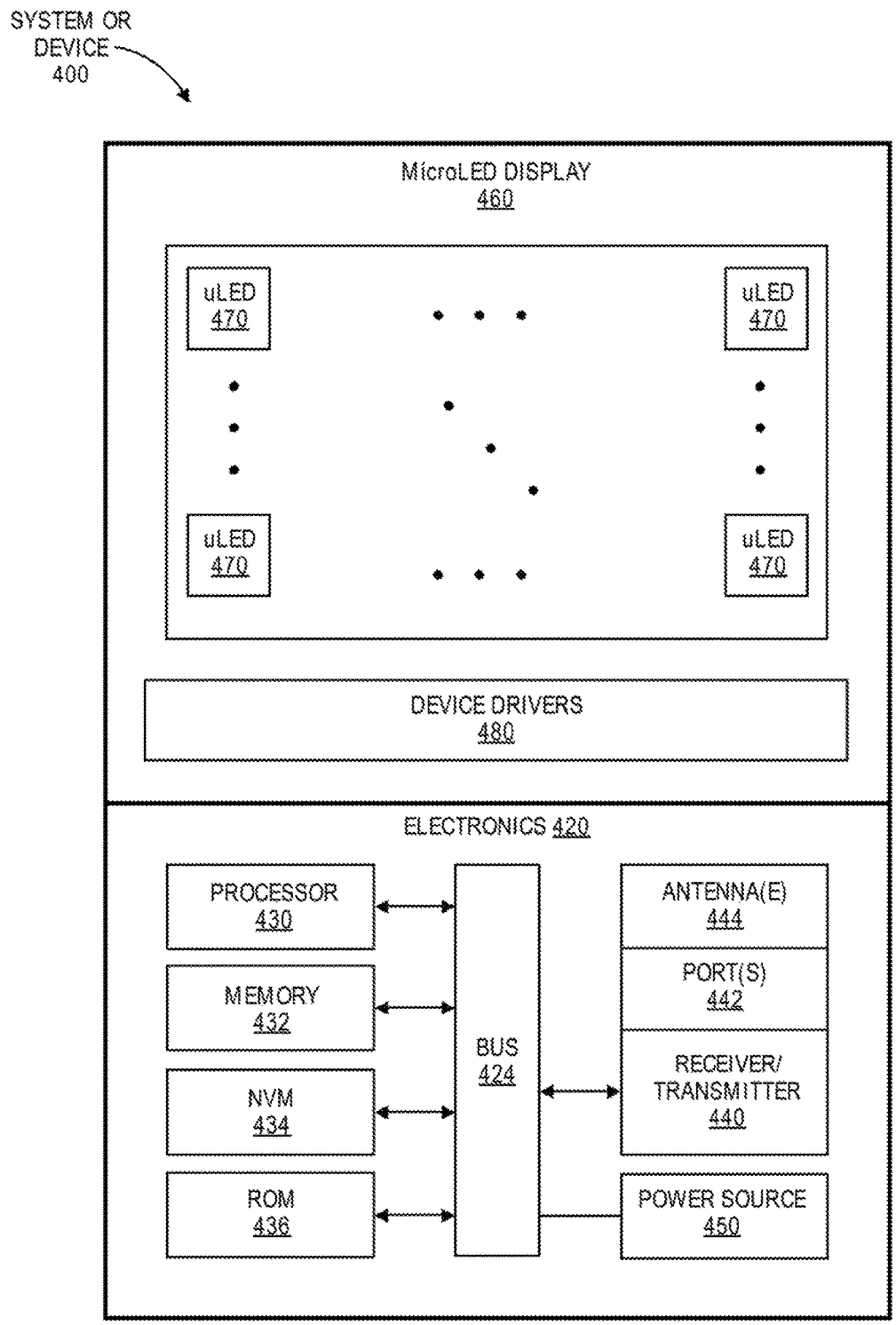
FIG. 4 is an illustration of an apparatus or system including micro LED devices with oxide current apertures according to an embodiment.

FIG. 4 is an illustration of a system or device including micro LED devices with oxide current apertures according to an embodiment. FIG. 4 provides a particular example of a system or device, and embodiments are not limited to such an example.

In some embodiments, a system or device 400 includes, for example, a micro LED display 460 or other devices including the implementation of micro LED devices 470, wherein the micro LED devices are devices including, but not limited to, one or more oxide current apertures such as formed in FIGS. 2A to 2D and FIG. 3. In some embodiments, a micro LED display 460 may include device drivers 480 for the micro LED devices 470.

In some embodiments, the system or device 400 further includes certain system or device electronics 420. In some embodiments, the electronics 420 may further include one or more buses or interconnects for the connection of electrical components, shown in general as bus 424. The bus 424 is a communication means for transmission of data. The bus 424 is illustrated as a single bus for simplicity, but may represent multiple different interconnects or buses and the component connections to such interconnects or buses may vary. The bus 424 shown in FIG. 4 is an abstraction that represents any one or more separate physical buses, point-to-point connections, or both connected by appropriate bridges, adapters, or controllers.

In some embodiments, the supporting electronics 420 may include a processing means, shown as processor 430 coupled to the bus 424, to provide control instructions for the system or device. The processing means 430 may include one or more processors or controllers, including one or more physical processors and one or more logical processors. In some embodiments, the processing means 430 may include one or more general-purpose processors or special-processor processors.

In some embodiments, the electronics 420 further includes a random access memory (RAM) or other dynamic storage device or element as a main memory 432 for storing information and instructions to be executed by the processing means 430. In some embodiments, the electronics 420 also may further include a non-volatile memory 434; and a read only memory (ROM) 436 or other static storage device for storing static information and instructions for the processing means 430.

In some embodiments, the electronics 420 may include one or more transmitters or receivers 440 coupled to the bus 424. In some embodiments, the electronics 420 may include one or more antennae 444, such as dipole or monopole antennae, for the transmission and reception of data via wireless communication using a wireless transmitter, receiver, or both, and one or more ports 442 for the transmission and reception of data via wired communications. Wireless communication includes, but is not limited to, Wi-Fi, Bluetooth™, near field communication, and other wireless communication standards. Wired communication includes, but is not limited to, USB® (Universal Serial Bus) and FireWire® ports.

The electronics 420 may also include a battery or other power source 450, which may include a solar cell, a fuel cell, a charged capacitor, near field inductive coupling, or other system or device for providing or generating power in the supporting electronics 420. The power provided by the power source 450 may be distributed as required to elements of the electronics 420.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit (ASIC) or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

In some embodiments, a semiconductor device includes an N-type semiconductor layer; an active region on the N-type semiconductor layer; a P-type semiconductor layer; and an oxide current aperture between the P-type semiconductor layer and the active region, wherein the oxide current aperture includes a non-oxidized region surrounded by an oxidized region.

In some embodiments, a method for fabricating a semiconductor device includes generating a wafer, including generating an N-type semiconductor layer, an active region on the N-type semiconductor layer, an oxidizing layer, and a P-type semiconductor layer; etching to expose a surface of the oxidizing layer; and allowing oxidation of a first region of the oxidizing layer, wherein a second region of the oxidizing layer remains non-oxidized.

What is claimed is:

1. A semiconductor device including a light emitting diode (LED), comprising:
   an N-type semiconductor layer;
   an active region including aluminum indium gallium phosphide (AlInGaP) to emit red light from the LED, wherein the N-type semiconductor layer is located proximate to a first side of the active region;
   a P-type semiconductor layer located proximate to a second opposite side, opposite the first side, of the active region; and
   one or more oxide current apertures including a first oxide current aperture, wherein each oxide current aperture includes a non-oxidized region surrounded by an oxidized region positioned to direct current through the non-oxidized region into the AlInGaP to emit the red light.

2. The semiconductor device of claim 1, wherein the non-oxidized region of the first oxide current aperture is at least in part in a center of the semiconductor device.

3. The semiconductor device of claim 1, wherein the first oxide current aperture includes an aluminum containing material.

4. The semiconductor device of claim 3, wherein the first oxide current aperture includes one of AlAs (aluminum arsenide) or Al(Ga)As (aluminum gallium arsenide).

5. The semiconductor device of claim 1, wherein the restriction of current flow in the semiconductor device is to reduce surface recombination in the semiconductor device.

6. The semiconductor device of claim 1, wherein the first oxide aperture is located on the N-type side of the active region.

7. The semiconductor device of claim 1, wherein the first oxide aperture is located on the P-type side of the active region.

8. The semiconductor device of claim 1, wherein the first oxide aperture is located on either the N-type side or P-type side of the action region, and wherein a thickness of the oxide aperture is one of:
- less than 100 nm (nanometers);
- less than 10 nm; or
- less than 1 µm (micrometers).

9. The semiconductor device of claim 8, wherein the first oxide aperture is located:
- within 100 nm of the active region;
- within 10 nm of the active region; or
- within 1 µm of the active region placement.

10. The semiconductor device of claim 1, wherein the first oxide aperture is located within the active region.

11. The semiconductor device of claim 10, wherein the first oxide aperture is embedded by depositing large bandgap layers that may be oxidized, the large bandgap layers being interspersed with light emitting layers.

12. The semiconductor device of claim 10, wherein a thickness of the first oxide aperture is one of:
- less than 100 nm (nanometers); or
- less than 10 nm.

13. The semiconductor device of claim 1, wherein a combination of a location and a thickness of each oxide aperture are selected to optimize forward voltage, light output, light output pattern, current handling, reliability, or any combination thereof for the semiconductor device.

14. A system comprising:
a processing element; and
an LED display including a plurality of micro LED devices that emit visible light, wherein at least some of the plurality of micro LED devices include:
an N-type semiconductor layer,
a light emitting region structured to emit red light, wherein the N-type semiconductor layer is located proximate to a first side of the light emitting region,
a P-type semiconductor layer located proximate to a second side, opposite the first side, of the light emitting region, and
one or more oxide current apertures including a non-oxidized region surrounded by an oxidized region positioned to direct current through the non-oxidized region into the light emitting region to emit the red light.

15. The system of claim 14, wherein the light emitting region includes AlInGaP disposed to receive current through the one or more oxide current apertures to emit the red light.

16. The system of claim 15, wherein the plurality of micro LED devices is non-lasing.

17. The system of claim 16, wherein at least some of the plurality of micro LED devices have a lateral dimension of 20 microns or less.

* * * * *

UNITED STATES PATENT AND TRADEMARK OFFICE
CERTIFICATE OF CORRECTION

PATENT NO. : 9,812,609 B1  
APPLICATION NO. : 15/096118  
DATED : November 7, 2017  
INVENTOR(S) : M. Grundmann et al.

Page 1 of 1

It is certified that error appears in the above-identified patent and that said Letters Patent is hereby corrected as shown below:

In the Claims

| Column | Line | Error |
|---|---|---|
| 8 (Claim 1, Line 9) | 42 | "second opposite side," should read --second side,-- |

Signed and Sealed this  
Twenty-fourth Day of April, 2018

Andrei Iancu  
*Director of the United States Patent and Trademark Office*